(12) United States Patent
Yan et al.

(10) Patent No.: US 10,868,266 B2
(45) Date of Patent: Dec. 15, 2020

(54) SEMICONDUCTOR THIN-FILM AND MANUFACTURING METHOD THEREOF, THIN-FILM TRANSISTOR, AND DISPLAY APPARATUS

(71) Applicants: BOE TECHNOLOGY GROUP CO., LTD., Beijing (CN); SOUTH CHINA UNIVERSITY OF TECHNOLOGY, Guangdong (CN)

(72) Inventors: Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNIVERSITY OF TECHNOLOGY, Guangdong (CN)

( * ) Notice: Subject to any disclaimer, the term of this patent is extended or adjusted under 35 U.S.C. 154(b) by 217 days.

(21) Appl. No.: 15/765,262

(22) PCT Filed: Sep. 18, 2017

(86) PCT No.: PCT/CN2017/102106
§ 371 (c)(1),
(2) Date: Mar. 31, 2018

(87) PCT Pub. No.: WO2018/076960
PCT Pub. Date: May 3, 2018

(65) Prior Publication Data
US 2019/0067609 A1    Feb. 28, 2019

(30) Foreign Application Priority Data
Oct. 28, 2016    (CN) .......................... 2016 1 0966561

(51) Int. Cl.
*H01L 51/05* (2006.01)
*H01L 51/00* (2006.01)

(52) U.S. Cl.
CPC ...... *H01L 51/0562* (2013.01); *H01L 51/0545* (2013.01); *H01L 51/0003* (2013.01)

(58) Field of Classification Search
CPC .............. H01L 51/0562; H01L 51/0545; H01L 51/0003; H01L 51/0558; H01L 51/0566
See application file for complete search history.

(56) References Cited

U.S. PATENT DOCUMENTS 7,816,671 B2    10/2010 Park et al.
2006/0094172 A1 *    5/2006 Lee ..................... H01L 51/0021
                                                             438/149

(Continued)

FOREIGN PATENT DOCUMENTS

CN    101777625 A    7/2010
CN    102460712 A    5/2012

OTHER PUBLICATIONS

Yang et al., "Ambipolar thin-film transistors and an inverter based on pentacene/self-assembled monolayer modified ZnO hybrid structures for balanced hole and electron mobilities," 2011, Organic Electronics, 12, 411-418. (Year: 2011).*

(Continued)

*Primary Examiner* — Benjamin Tzu-Hung Liu
(74) *Attorney, Agent, or Firm* — Syncoda LLC; Feng Ma

(57) ABSTRACT

A method for manufacturing a semiconductor thin film includes sequentially forming a first semiconductor layer, an intermediate layer, and a second semiconductor layer over a substrate. The first semiconductor layer and the second semiconductor layer can be one and another of an n-type semiconductor layer and a p-type semiconductor layer. At least one of the first semiconductor layer, the intermediate layer, or the second semiconductor layer is formed via a (Continued)

solution process. The n-type semiconductor layer can include indium oxide. The intermediate layer can include a self-assembly material. The p-type semiconductor layer can include a p-type organic semiconductor material, and can be pentacene. On the basis, a semiconductor thin film manufactured thereby, a semiconductor thin film transistor, and a display apparatus, are also disclosed.

13 Claims, 9 Drawing Sheets

(56) References Cited

U.S. PATENT DOCUMENTS

| | | | |
|---|---|---|---|
| 2012/0037897 A1 | 2/2012 | Shiino et al. | |
| 2014/0091300 A1* | 4/2014 | Pan | H01L 51/0043 257/40 |
| 2015/0364684 A1* | 12/2015 | Miao | C07F 9/4018 257/40 |
| 2017/0012227 A1* | 1/2017 | Zan | H01L 51/0558 |

OTHER PUBLICATIONS

2nd Office Action in CN201610966561.6, dated Jul. 8, 2019.
International Search Report in PCT/CN2017/102106, dated Dec. 21, 2017.
"Ambipolar field-effect transistor based on organic-inorganic hybrid structure" by Hajime Nakanotani et al., Applied Physics Letters 90, 262104 2007.
"Ambipolar thin-film transistors and an inverter based on pentacene/self-assembled monolayer modified ZnO hybrid structures for balanced hole and electron mobilities" by Yang et al., Organic Electronics 12 (2011) 411-418.
1st Office Action in CN201610966561.6, dated Mar. 5, 2019.
"Molecular Self-Assemble4d Monolayers and Multilayers for Organic and Unconventional Inorganic Thin-Film Transistor Applications" by DiBenedetto, Sara A. et al., Adv. Mater., 2009, vol. 21, pp. 1407-1433, Apr. 14, 2009.

* cited by examiner

SEMICONDUCTOR THIN-FILM AND MANUFACTURING METHOD THEREOF, THIN-FILM TRANSISTOR, AND DISPLAY APPARATUS

CROSS-REFERENCE TO RELATED APPLICATION

The present application claims priority to Chinese Patent Application No. 201610966561.6, filed on Oct. 28, 2016, the disclosure of which is hereby incorporated by reference in its entirety.

TECHNICAL FIELD

The present disclosure is related generally to the field of display technologies, and more specifically to a semiconductor thin film and a manufacturing method thereof, a thin-film transistor and a manufacturing method thereof, an array substrate, and a display apparatus.

BACKGROUND

Thin-film transistors (TFTs) are one of the most crucial electronic components in the field of flat-panel displays, and can be widely employed for controlling and driving liquid crystal displays (LCDs), and for forming sub-pixels in organic light-emitting diode (OLED) displays.

Currently, the majority of conventional TFTs are unipolar, i.e., most current TFTs can only be of n-type or of p-type. High-performance n-type semiconductor materials primarily include amorphous silicon and oxides, among which oxide semiconductor materials have advantages such as a high carrier mobility rate, transparency to visible light, and flexibility of solution processing. Because of these advantages, oxide semiconductors are becoming more popular in TFT array substrates in the field of flat-panel displays, and tend to substitute TFTs fabricated with traditional silicon processes.

Conductivity of a metal oxide semiconductor material is mainly mediated by oxygen vacancies and metal ions in the gap, which provide donor electrons. A metal oxide semiconductor material generally has a relatively high electron mobility rate, but has a relatively low hole mobility rate. As such, it has remained a challenge to obtain a p-type metal oxide TFT.

An organic semiconductor material typically has a relatively good p-type performance, but a relatively poor n-type performance. Compared with an inorganic semiconductor material, an organic semiconductor material has advantages such as having more film fabrication approaches, and simpler fabrication processes. An electronic component based on an organic semiconductor material can have a relatively smaller size, and relatively better flexibility. As such, the organic semiconductor material is suitable for the manufacture of flexible electronic components. In addition, the performance of the electronic components based on the organic semiconductor material can be improved by modifying the structure of the organic molecules.

In recent years, advances have been made in some properties of organic semiconductor materials, such as the mobility rates, switching ratios, and stability. As such, organic semiconductor materials have a broad prospect in applications including displays and sensors.

From a practical perspective, a bipolar component, which simultaneously has an n-type performance and a p-type performance, can be employed for driving LCDs, electronic papers, or solar cells, having advantages such as low energy consumption and simple fabrication processes.

Based on results of testing bipolar TFTs fabricated by the above two approaches, bipolar TFTs fabricated by the first approach have relatively poor performances, whereas bipolar TFTs fabricated by the second approach have poor mobility rates and stabilities.

SUMMARY

The present disclosure provides a semiconductor thin film and a manufacturing method thereof, a thin-film transistor and a manufacturing method thereof, an array substrate, and a display apparatus, aiming at improving the performance, reliability, and stability of the thin-film transistors.

In a first aspect, the present disclosure provides a method for manufacturing a semiconductor thin film. The method includes the following steps:

Forming a first semiconductor layer over a substrate;

Forming an intermediate layer over the first semiconductor layer; and

Forming a second semiconductor layer over the intermediate layer.

Herein it is configured such that one of the forming a first semiconductor layer over a substrate and the forming a second semiconductor layer over the intermediate layer comprises:

forming an n-type semiconductor layer.

Herein it is further configured such that another of the forming a first semiconductor layer over a substrate and the forming a second semiconductor layer over the intermediate layer comprises: forming a p-type semiconductor layer.

Herein it is additionally configured such that at least one of the forming a first semiconductor layer over a substrate, the forming an intermediate layer over the first semiconductor layer, or the forming a second semiconductor layer over the intermediate layer is via a solution process.

According to some embodiments of the method, each of the forming a first semiconductor layer over a substrate, the forming an intermediate layer over the first semiconductor layer, and the forming a second semiconductor layer over the intermediate layer is via a solution process.

According to some embodiments of the method, the forming an n-type semiconductor layer is via a solution process.

In the method, the n-type semiconductor layer can comprise an inorganic oxide semiconductor material.

According to some embodiments of the method, the n-type semiconductor layer comprises indium oxide, and the forming an n-type semiconductor layer comprises the following sub-steps:

Coating a first surface with a solution of indium chloride; and

Treating the first surface to thereby form an n-type semiconductor thin film thereon.

According to some embodiments of the method, the forming an n-type semiconductor layer further comprises:

Patterning the n-type semiconductor thin film to thereby form the n-type semiconductor layer on the first surface.

According to some embodiments of the method, the intermediate layer comprises a self-assembly material, configured to reduce surface roughness between an inorganic semiconductor layer and an organic semiconductor layer and improve hole mobility in the p-type semiconductor material.

Herein the self-assembly material can comprise a phosphate ester capable of self-assembly, which can be polyol phosphoester, polyoxyethylene alkyl ether, tributyl phosphate, and trioctyl phosphate, etc.

Accordingly, the forming an intermediate layer over the first semiconductor layer comprises:

Submerging a top surface of the first semiconductor layer in an alcohol solution of the phosphate ester for a certain amount of time to form a thin layer of phosphate ester over the top surface of the first semiconductor layer.

According to some embodiments of the method, the p-type semiconductor layer comprises a p-type organic semiconductor material capable of solution preparation to thereby form the p-type semiconductor layer, and can be pentacene.

Herein the forming a p-type semiconductor layer can comprise a sub-step of:

spin-coating, printing, or pulling a solution of the p-type organic semiconductor material.

In a second aspect, the disclosure further provides a method for manufacturing a thin-film transistor (TFT). The method includes:

Forming a semiconductor active layer over a substrate, comprising the method for manufacturing a semiconductor thin film according to any one of the embodiments as described above.

According to some embodiments, the method further includes:

Forming a source electrode and a drain electrode over the semiconductor thin film.

According to some embodiments of the method, each of the forming a gate electrode over the substrate, the forming a gate electrode insulating layer over the gate electrode, the forming the semiconductor thin film over the gate electrode insulating layer, and the forming a source electrode and a drain electrode over the semiconductor thin film can be carried out under a temperature of no more than 230° C., and can be carried out via a solution process.

According to some embodiments, prior to the forming a semiconductor active layer over a substrate the method further includes:

Forming a gate electrode over the substrate; and

Forming a gate electrode insulating layer over the gate electrode.

Herein it is configured such that the forming a semiconductor active layer over a substrate comprises:

Forming the semiconductor thin film over the gate electrode insulating layer.

In the method as described above, at least one of the forming a gate electrode over the substrate and the forming a source electrode and a drain electrode over the semiconductor thin film can comprise:

Printing a conductive material, wherein the conductive material comprises at least one of silver gel, PEDOT, or a carbon nanotube.

In a third aspect, the disclosure further provides a semiconductor thin film. The semiconductor thin film comprises a first semiconductor layer, an intermediate layer, and a second semiconductor layer.

The first semiconductor layer and the second semiconductor layer are stacked over one another, and respectively comprise one and another of an n-type semiconductor material and a p-type semiconductor material. The n-type semiconductor material and the p-type semiconductor material are each configured to allow solution preparation. The intermediate layer comprises a self-assembly material, and is disposed between, and configured to contact, the first semiconductor layer and the second semiconductor layer.

In the semiconductor thin film as described above, the self-assembly material can comprise a phosphate ester, which can be polyol phosphoester, polyoxyethylene alkyl ether, tributyl phosphate, and trioctyl phosphate, etc. The n-type semiconductor material can comprise indium oxide. The p-type semiconductor material can comprise a p-type organic semiconductor material.

In a fourth aspect, the disclosure further provides a thin-film transistor (TFT). The thin-film transistor (TFT) includes a substrate and a semiconductor active layer, wherein the semiconductor active layer comprises a semiconductor thin film according to any one of the embodiments as described above.

In a fifth aspect, the disclosure further provides a display apparatus, which includes the aforementioned thin-film transistor.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1A:
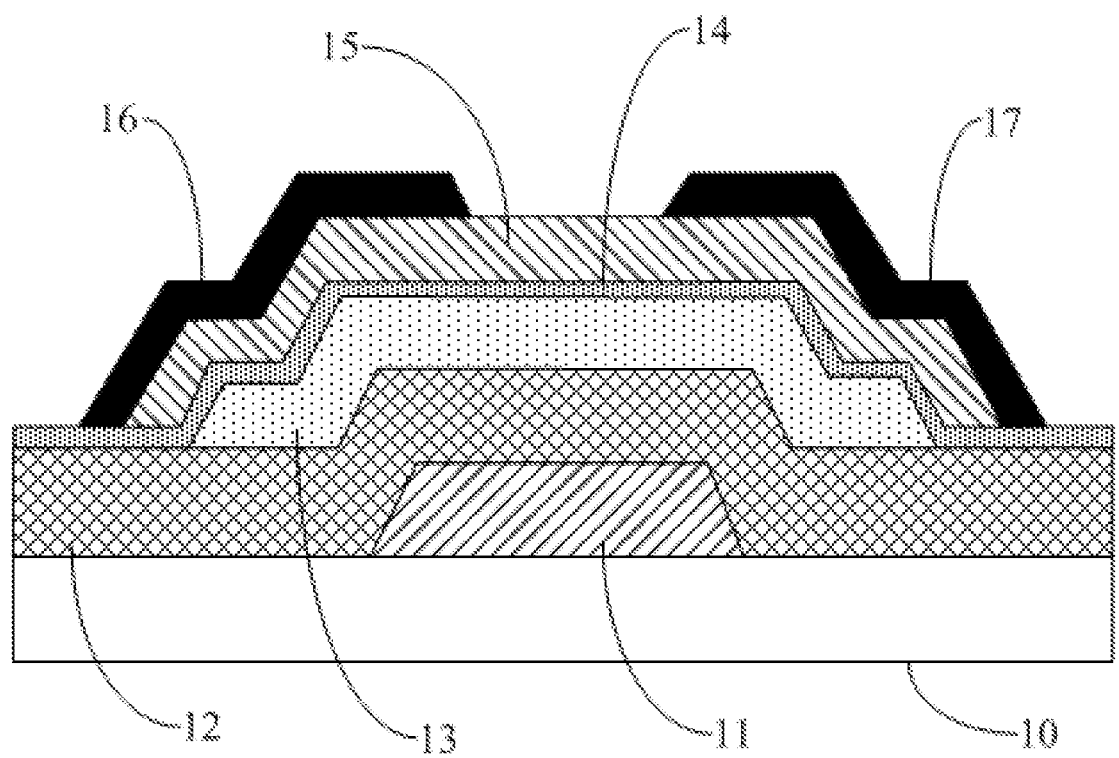
FIG. 1A illustrates a structural diagrams of a thin-film transistor (TFT) according to a first embodiment of the present disclosure.

In the following, with reference to the drawings of various embodiments disclosed herein, the technical solutions of the embodiments of the disclosure will be described in a clear and fully understandable way.

The present disclosure provides a semiconductor thin film and a manufacturing method thereof, a thin-film transistor (TFT) and a manufacturing method thereof, an array substrate, and a display apparatus, aiming at improving the performance, reliability, and stability of the thin-film transistors.

In a first aspect, the present disclosure provides a semiconductor thin film. The semiconductor thin film comprises an n-type semiconductor layer and a p-type semiconductor layer, which can be stacked together. In some embodiments, the semiconductor thin film can further comprise a self-assembly layer disposed between, and coupled to, the n-type semiconductor layer and the p-type semiconductor layer. In some implementations, the self-assembly layer can comprise a self-assembly material, such as a phosphate ester. Herein the phosphate ester can be polyol phosphoester, polyoxyethylene alkyl ether, tributyl phosphate, and trioctyl phosphate, etc.

The semiconductor thin film as described above has improved performances compared with conventional semiconductor thin films in a number of aspects. In addition, because of the presence of both the n-type semiconductor layer and the p-type semiconductor layer that are stacked over one another in the semiconductor thin film, a TFT having such a semiconductor thin film as an active layer can be a bipolar TFT.

Because of the stacked arrangement of the n-type semiconductor layer and the p-type semiconductor layer in the semiconductor thin film, during fabrication of the TFT, the n-type semiconductor layer and the p-type semiconductor layer can be separately manufactured.

As such, compared with fabricating a bipolar TFT using a conventional method, which has either a mixed n-type and p-type semiconductor materials or a single semiconductor material having both n-type and p-type properties, the TFT according to various embodiments disclosed herein can have improved reliability, stability, and performance.

In the semiconductor thin film as described above, the arrangement of the self-assembly layer can improve the contact between the n-type semiconductor layer and the p-type semiconductor layer, which in turn can lead to an improved performance of the TFT having the semiconductor thin film.

In addition, because the n-type semiconductor layer and the p-type semiconductor layer are stacked over one another in the semiconductor thin film, and the self-assembly layer disposed between the n-type semiconductor layer and the p-type semiconductor layer comprises a phosphate ester that is capable of self-assembly, the semiconductor thin film has an improved semiconducting performance.

Mover, the TFT can be fabricated via a solution process. The solution process can greatly simplify the manufacturing process, and is especially useful for the fabrication of large-area and flexible electronic components.

According to some embodiments of the present disclosure, the n-type semiconductor layer can comprise an n-type inorganic semiconductor material, such as an inorganic oxide semiconductor material. The inorganic oxide semiconductor material can be, for example, zinc oxide (ZnO), indium zinc oxide (IZO), or indium oxide ($In_2O_3$).

In some embodiments, the inorganic oxide semiconductor material has a composition that allows for a solution-based fabrication process. One example of such materials is the $In_2O_3$. To process the indium oxide n-type semiconductor layer, for example, a solution of indium chloride ($InCl_3$) can be first applied to a surface by spin-coating, which then undergoes heating to get rid of the solvent to thereby form a thin film of $InCl_3$. Upon UV exposure in an environment containing oxygen (such as air), hydrolysis can occur on the $InCl_3$ thin film to ultimately form the n-type semiconductor layer (i.e. $In_2O_3$ semiconductor layer) with desired patterns.

In some other embodiments of the present disclosure, the n-type semiconductor layer can comprise an n-type organic semiconductor material. The n-type organic semiconductor material may have a poorer performance compared with an n-type inorganic semiconductor material.

According to some embodiments of the present disclosure, the p-type semiconductor layer can comprise a p-type organic semiconductor material. According to some other embodiments of the present disclosure, the p-type semiconductor layer can comprise a p-type inorganic semiconductor material.

To apply a solution process to manufacture the p-type semiconductor layer, the p-type semiconductor layer can comprise a p-type organic semiconductor material, such as pentacene. Specifically, a solution of pentacene can be spin-coated onto the self-assembly layer, which then undergoes heating to get rid of the solvent to thereby obtain the p-type semiconductor layer.

It is further noted that the composition for the self-assembly layer can be selected to have a good semiconductor property, and can be a phosphate ester that is capable of self-assembly. Herein the phosphate ester can be polyol phosphoester, polyoxyethylene alkyl ether, tributyl phosphate, and trioctyl phosphate, etc.

Herein self-assembly is defined as process in which a plurality of basic structural units (e.g. molecules, nanomaterials) form a highly organized structure or pattern as a consequence of specific, local interactions (such as non-covalent bonds) among the basic structural units themselves, without external direction.

In another aspect, a TFT is also provided. The TFT can comprise a substrate, and a semiconductor active layer disposed over the substrate. The semiconductor active layer comprises the semiconductor thin film according to any of the embodiments disclosed herein.

As a result of adopting the semiconductor thin film described above as the semiconductor active layer, the TFT according to embodiments disclosed herein can have an improved reliability and stability compared with conventional TFTs.

In the following, with reference to the drawings, a detailed description is provided for the TFT according to some specific implementations.

It is noted that thicknesses, sizes, and shapes of the individual layers or components as shown in the drawings are for illustration purposes only, and do not necessarily reflect real dimensions.

FIG. 1A illustrates a structural diagram of a TFT according to a first embodiment of the present disclosure. As shown, the TFT comprises, from bottom up, a substrate 10, a gate electrode 11, a gate electrode insulating layer 12, an n-type semiconductor layer 13, a self-assembly layer 14, a p-type semiconductor layer 15, a source electrode 16, and a drain electrode 17.

As shown, the gate electrode 11 is disposed over the substrate 10; the gate electrode insulating layer 12 is disposed over the gate electrode 11; the n-type semiconductor layer 13 is disposed over the gate electrode insulating layer 12; the self-assembly layer 14 is disposed over the n-type semiconductor layer 13; the p-type semiconductor layer 15 is disposed over the self-assembly layer 14; and the source electrode 16 and the drain electrode 17 are disposed over the p-type semiconductor layer 15.

Figure 1B:
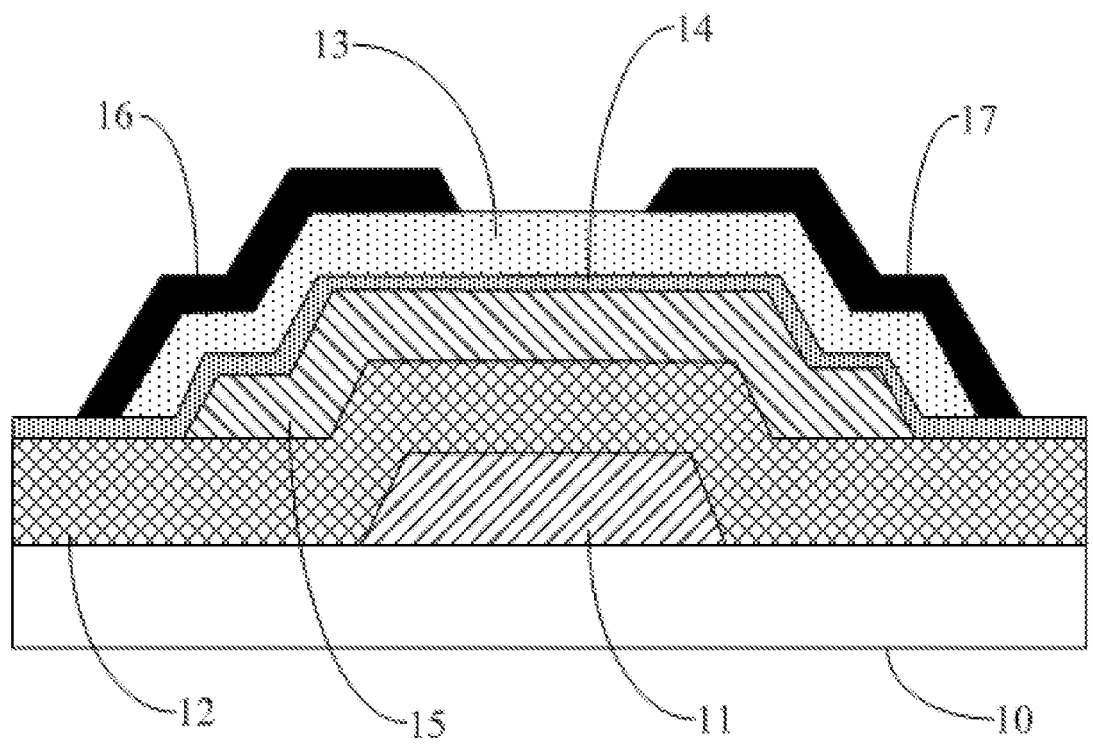
FIG. 1B illustrates a structural diagrams of a thin-film transistor according to a second embodiment of the present disclosure.
Figure 2:
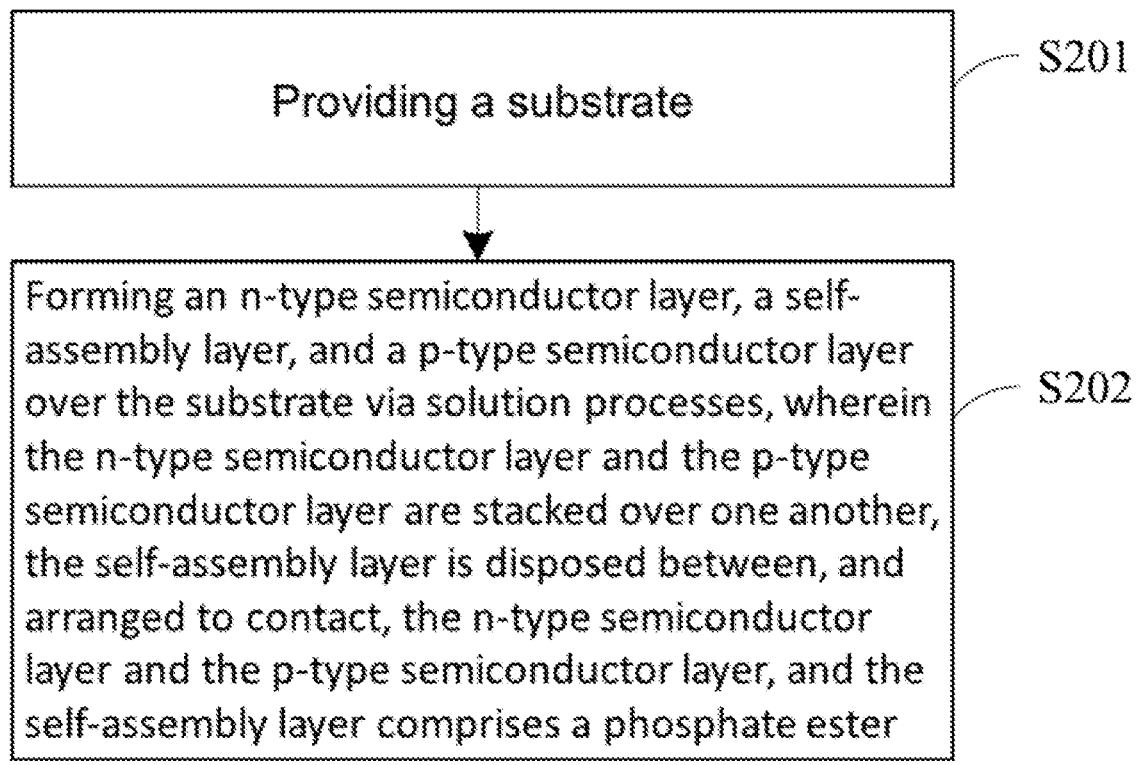
FIG. 2 illustrates a flowchart of a method for manufacturing a semiconductor thin film according to some embodiments of the present disclosure.

FIG. 1B illustrates a structural diagram of a TFT according to a second embodiment of the present disclosure. The TFT comprises, from bottom up, a substrate 10, a gate electrode 11, a gate electrode insulating layer 12, an p-type semiconductor layer 15, a self-assembly layer 14, an n-type semiconductor layer 13, a source electrode 16, and a drain electrode 17.

As shown, the gate electrode 11 is disposed over the substrate 10; the gate electrode insulating layer 12 is disposed over the gate electrode 11; the p-type semiconductor layer 15 is disposed over the gate electrode insulating layer 12; the self-assembly layer 14 is disposed over the p-type semiconductor layer 15; the n-type semiconductor layer 13 is disposed over the self-assembly layer 14; and the source electrode 16 and the drain electrode 17 are disposed over the n-type semiconductor layer 13.

In some embodiments of the TFT, the n-type semiconductor layer 13 can comprise an inorganic oxide semiconductor material, such as indium oxide; the self-assembly layer 14 can comprise a phosphate ester material capable of self-assembly; and the p-type semiconductor layer 15 can comprise a p-type organic semiconductor material. The above mentioned combination of the compositions for each of the n-type semiconductor layer, the self-assembly layer, and the p-type semiconductor layer in the TFT as described above allows for fabrication of the TFT via solution processes, which in turn result in an improved property and performance of the TFT.

In either the first embodiment or the second embodiment of the TFT described above, the substrate 10 can be glass, or can be a plastic. One of the gate electrode 11, the source electrode 16, or the drain electrode 17 can comprise a metal, a conductive adhesive such as a silver gel, or a conductive polymer such as PEDOT and carbon nanotubes. The gate electrode insulating layer 12 can comprise an organic insulating material such as PVP.

In another aspect, an array substrate is provided. The array substrate comprises a plurality of TFTs according to any of the embodiments as described above.

In another aspect, a display apparatus is provided. The display apparatus comprises the array substrate as described above.

In another aspect, a method is provided for manufacturing a semiconductor thin film according to some of the embodiments as described above. The method can comprise the following steps:

S201: providing a substrate;

S202: forming an n-type semiconductor layer, a self-assembly layer, and a p-type semiconductor layer over the substrate via solution processes, wherein the n-type semiconductor layer and the p-type semiconductor layer are stacked over one another, the self-assembly layer is disposed between, and arranged to contact, the n-type semiconductor layer and the p-type semiconductor layer. The self-assembly layer comprises a material capable of self-assembly. In some embodiments, the material capable of self-assembly can be, for example, a phosphate ester.

In the method for manufacturing a semiconductor thin film as described above, a set of solution processes can be applied. The solution processes can greatly simplify the manufacturing process of semiconductor thin films, and are especially useful for the fabrication of large-area and flexible electronic components.

Specifically, the step of forming an n-type semiconductor layer, a p-type semiconductor layer, and a self-assembly layer over the substrate via a solution process (i.e., S202) can comprise the following sub-steps.

In a first embodiment of the method, the step of S202 comprises:

(1) forming the n-type semiconductor layer over the substrate via a first solution process;

According to some embodiments of the present disclosure, a solution of indium chloride ($InCl_3$) can be applied over the substrate by spin-coating, printing, or pulling to thereby form the n-type semiconductor layer.

(2) forming the self-assembly layer over the n-type semiconductor layer via a second solution process;

According to some embodiments of the present disclosure, the substrate having the n-type semiconductor layer disposed thereover can be submerged in an alcohol solution of a phosphate ester for a certain amount of time before taking out and cleansing to thereby form the self-assembly layer.

(3) forming the p-type semiconductor layer over the self-assembly layer via a third solution process.

According to some embodiments of the present disclosure, a solution containing a p-type semiconductor material can be applied over the self-assembly layer by spin-coating, printing, or pulling to thereby form the p-type semiconductor layer.

In a second embodiment of the method, the step S202 comprises:

(1) forming the p-type semiconductor layer over the substrate via a fourth solution process;

According to some embodiments of the present disclosure, a solution containing a p-type semiconductor material can be applied over the substrate by spin-coating, printing, or pulling to thereby form the p-type semiconductor layer.

(2) forming the self-assembly layer over the p-type semiconductor layer via a fifth solution process;

According to some embodiments of the present disclosure, the substrate having the p-type semiconductor layer disposed thereover can be submerged in an alcohol solution of a phosphate ester for a certain amount of time before taking out and cleansing to thereby form the self-assembly layer.

(3) forming the n-type semiconductor layer over the self-assembly layer via a sixth solution process;

According to some embodiments of the present disclosure, a solution of indium chloride ($InCl_3$) can be applied over the self-assembly layer by spin-coating, printing, or pulling to thereby form the n-type semiconductor layer.

In another aspect, a method for manufacturing a TFT is provided.

The method can comprise steps of forming a gate electrode, a semiconductor active layer, a source electrode, and a drain electrode, respectively, wherein the step of forming the semiconductor active layer are described above with respect to the fabrication of a semiconductor thin film.

Although a method of fabricating a bottom-gate TFT is described as an illustrative example, other types of TFTs can be fabricated using methods similar to the embodiments disclosed herein.

According to some embodiments of the present disclosure, the method for manufacturing a TFT can comprise: sequentially forming a gate electrode, a gate electrode insulating layer, a semiconductor active layer, a source electrode, and a drain electrode.

The semiconductor active layer can be fabricated using the method for manufacturing the semiconductor thin film as described above.

Figure 3A:
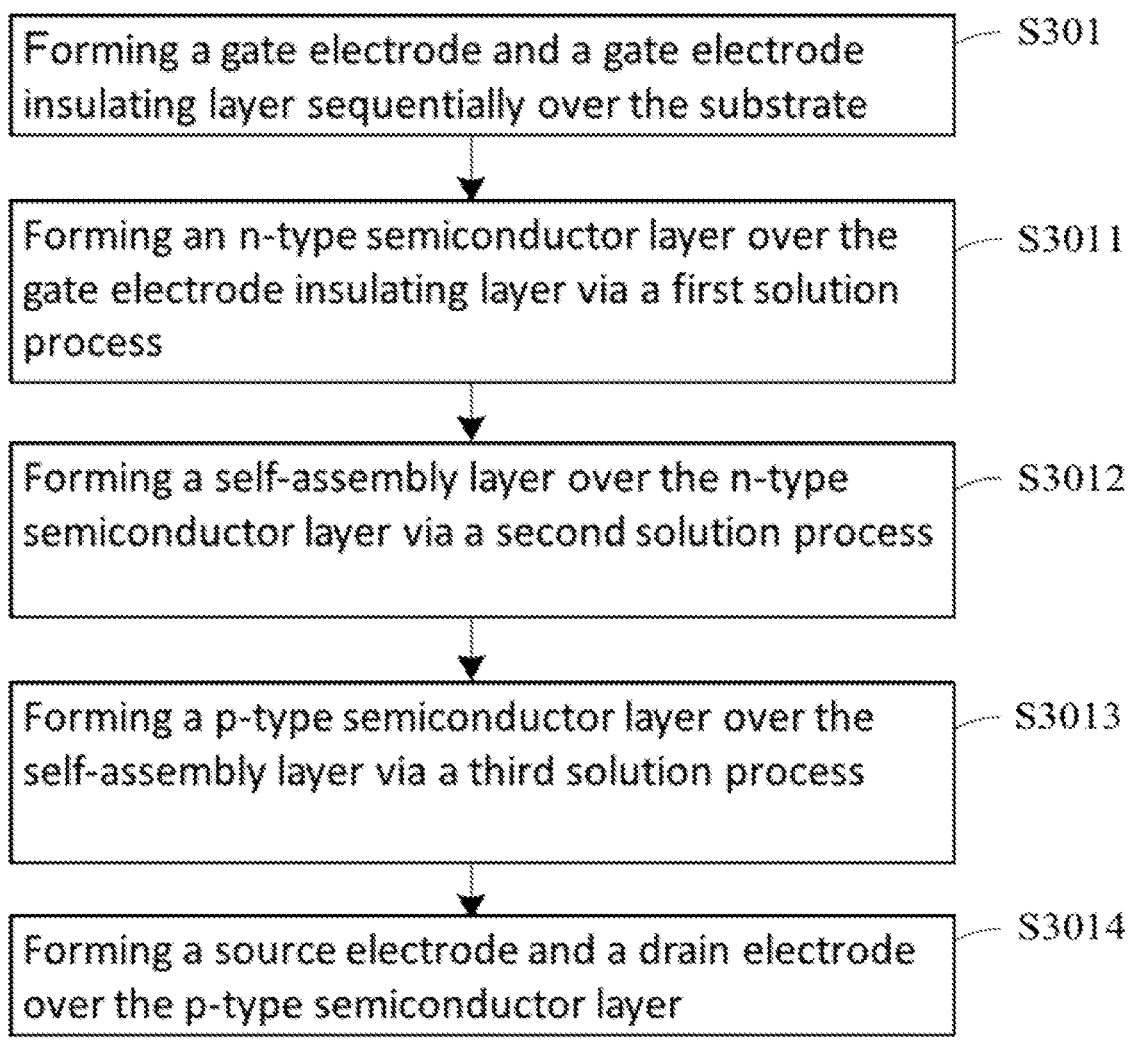
FIG. 3A illustrates a flowchart of a method for manufacturing a TFT according to one embodiment of the present disclosure.

Specifically, as shown in FIG. 3A, the method for manufacturing the TFT can comprise the following steps:

S301: forming a gate electrode and a gate electrode insulating layer sequentially over the substrate;

S3011: forming an n-type semiconductor layer over the gate electrode insulating layer via a first solution process;

S3012: forming a self-assembly layer over the n-type semiconductor layer via a second solution process;

S3013: forming a p-type semiconductor layer over the self-assembly layer via a third solution process;

S3014: forming a source electrode and a drain electrode over the p-type semiconductor layer.

In the abovementioned method, the step of forming a gate electrode over the substrate (e.g., part of step S301) can comprise:

(1) forming a conductive thin film over the substrate via a vapor deposition or a solution process; and (2) performing a first patterning process to the conductive thin film to thereby form the gate electrode.

The substrate can be a glass substrate, or can be a plastic substrate. The sub-step of performing a first patterning process to the conductive thin film to thereby form the gate electrode can be a conventional method to form a gate electrode.

In the above embodiments of the method, after the gate electrode is formed over the substrate, a gate electrode insulating layer can be further formed over the gate electrode (e.g., part of step S301), and the step can comprise:

forming an inorganic insulating layer over the gate electrode by deposition, printing, or spin-coating.

Herein the sub-step of forming the inorganic insulating layer over the gate electrode can reference to a conventional method for forming a gate electrode insulating layer over the gate electrode, and the description of the technical details of the sub-step is thus skipped.

In the above embodiments of the method, the step of forming an n-type semiconductor layer over the gate electrode insulating layer via a first solution process (i.e., step S3011) can comprise:

(1) forming an n-type semiconductor thin film over the gate electrode insulating layer, wherein a solution of indium chloride ($InCl_3$) can be applied over the gate electrode insulating layer by spin-coating, printing, or pulling to thereby form the n-type semiconductor thin film;

(2) performing a second patterning process to the n-type semiconductor thin film to thereby form the n-type semiconductor layer.

The second patterning process can include any one or a combination of coating, exposure, development, etching, or removal of a photoresist. In the embodiments of the method as described above, the solution of indium chloride ($InCl_3$) can undergo spin-coating, heating, UV exposure, and hydrolysis on the gate electrode insulating layer to thereby form the n-type semiconductor layer having a specific pattern.

In the above embodiments of the method as described above, the step of forming the self-assembly layer over the n-type semiconductor layer via a second solution process (i.e., step S3012) can comprise:

(1) submerging the substrate having the n-type semiconductor layer disposed thereover in an alcohol solution of a phosphate ester for a certain amount of time before taking out and cleansing to thereby form a self-assembly thin film over the n-type semiconductor layer; and (2) performing a third patterning process to the self-assembly thin film to thereby form the self-assembly layer.

For example, in some embodiments of the method, the substrate having the n-type semiconductor layer disposed thereover can be submerged in the alcohol solution of the phosphate ester for 2 hours, and is then taken out for supersonic cleansing to thereby form a self-assembly thin film over the n-type semiconductor layer.

It should be noted that in the above step, the self-assembly layer can be formed on the n-type semiconductor layer by other ways, for example, by spin-coating. There are no limitations herein.

In the embodiments of the method as described above, the step of forming a p-type semiconductor layer over the self-assembly layer via a third solution process (i.e., step S3013) can comprise:

(1) forming a p-type semiconductor thin film over the self-assembly layer by spin-coating, printing, or pulling; and (2) performing a fourth patterning process to the p-type semiconductor thin film to thereby obtain the p-type semiconductor layer.

In the embodiments of the method as described above, the step of forming a source electrode and a drain electrode over the p-type semiconductor layer (i.e., step S3014) can comprise:

(1) forming a conductive thin film over the p-type semiconductor layer via a vapor deposition or a solution process; and (2) performing a fifth patterning process to the conductive thin film to thereby form the source electrode and the drain electrode.

In the above sub-steps, the fifth patterning process to form the source electrode and the drain electrode can reference to conventional approaches, and there are no limitations herein.

According to some embodiments disclosure herein, a self-assembly layer is disposed between, and configured to contact, the n-type semiconductor layer and the p-type semiconductor layer, which can effectively solve the issue of a poor contact between the n-type semiconductor layer and the p-type semiconductor layer in a conventional bipolar thin-film transistor; and the poor contact between the n-type semiconductor layer and the p-type semiconductor layer can lead to a poor performance of the thin-film transistor.

With the self-assembly layer formed over the n-type semiconductor layer, surface roughness can be reduced to thereby decrease a surface energy, which in turn can facilitate an orderly formation of the p-type semiconductor thin film. The higher degree of order the p-type semiconductor layer can lead to a higher hole mobility rate of the p-type semiconductor layer. The problems of degraded performances of conventional TFTs resulting from poor direct contact between the n-type and p-type semiconductor layers, particularly between inorganic semiconductor and organic semiconductor layers, can thus be solved.

In the method for manufacturing a semiconductor thin film and/or a TFT as mentioned above, a solution process can be applied for each of the n-type semiconductor layer, the p-type semiconductor layer, and the self-assembly layer. The solution process can greatly simplify the manufacturing process of semiconductor thin films, and is especially appropriate for the fabrication of large-area and flexible electronic components.

In addition, in some embodiments of the semiconductor thin film and/or the TFT as mentioned above, the n-type semiconductor layer comprises an inorganic oxide semiconductor material, the self-assembly layer comprises a phosphate ester self-assembly material, and the p-type semiconductor layer comprises a p-type organic semiconductor material. During manufacturing, specific processes can be carefully designed and adjusted so as to obtain a bipolar thin-film transistor with superior performance.

In the following, with reference to some illustrative embodiments, a method for manufacturing a TFT via all-solution processes is described in detail.

First, a conductive thin film can be formed on a substrate by printing a silver gel, PEDOT, and a conductive polymer such as carbon nanotubes thereover; then a sixth patterning process is performed to the conductive thin film to thereby form a gate electrode. It is noted that in some embodiments, other approaches for forming a gate electrode over the substrate can also be applied, such as by a solution process involving spin-coating plus a patterning process.

Second, an organic insulating layer can be formed over the gate electrode by printing or spin-coating to thereby form a gate electrode insulating layer.

Third, a solution of indium chloride ($InCl_3$) can be applied over the gate electrode insulating layer by spin-coating, printing, or pulling to thereby form the n-type semiconductor thin film, which then undergoes a seventh patterning process to thereby form an n-type semiconductor layer.

Fourth, the substrate having the n-type semiconductor layer disposed thereover can be submerged in an alcohol solution of a phosphate ester for a certain amount of time before taking out and cleansing to thereby form the self-assembly thin film, which then undergoes an eighth patterning process to obtain a self-assembly layer.

Fifth, a p-type semiconductor thin film can be formed on the self-assembly layer by spin-coating, printing, or pulling, and then the p-type semiconductor thin film can undergo a ninth patterning process to thereby obtain a p-type semiconductor layer.

Sixth, a conductive thin film can be formed over the p-type semiconductor layer by printing a silver gel, PEDOT, and a conductive polymer such as carbon nanotubes thereover; then a tenth patterning process is performed to the conductive thin film to thereby form a source electrode and a drain electrode.

It is noted that according to some embodiments, other approaches for forming a source electrode and a drain electrode over the p-type semiconductor layer can also be applied, such as by a solution process involving spin-coating plus a patterning process.

In the aforementioned embodiment of the method (i.e., the all-solution method), the temperature for each of the processes as described above can be below 230° C. Additionally, the method applies all-solution processes for the manufacturing of bipolar thin-film transistor, which can greatly simplify the manufacturing process, and then involve simpler manufacturing equipment.

It is noted that the method as described above is illustrated with a bottom-gate TFT as an example, but the method can also be applied to a top-gate TFTs, or other types of thin-film transistor.

Figure 3B:
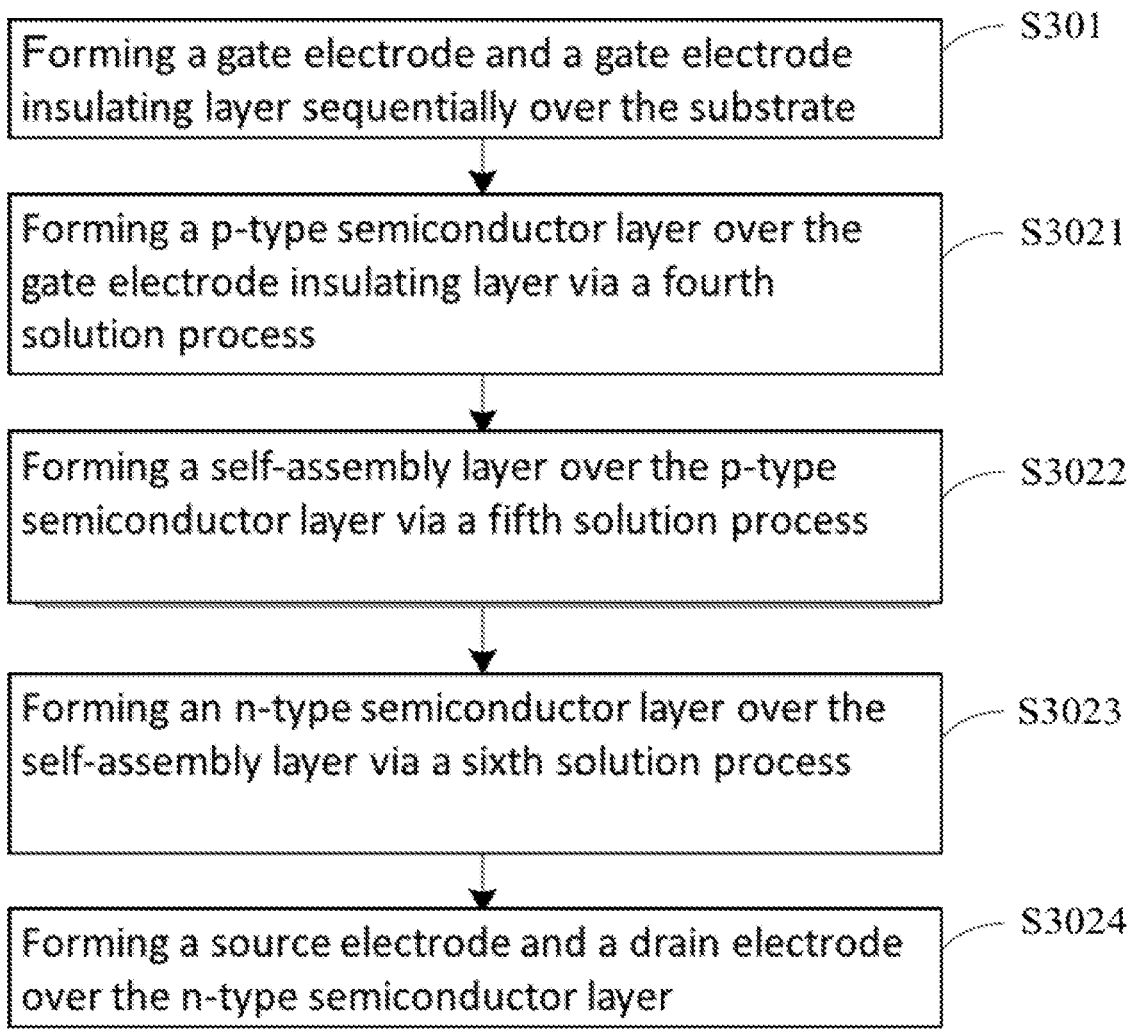
FIG. 3B illustrates a flowchart of a method for manufacturing a TFT according to another embodiment of the present disclosure.

FIG. 3B illustrates a method for manufacturing a TFT according to a second embodiment of the present disclosure. The method can comprise the following steps:

S301: forming a gate electrode and a gate electrode insulating layer sequentially over the substrate;

S3021: forming a p-type semiconductor layer over the gate electrode insulating layer via a fourth solution process;

S3022: forming a self-assembly layer over the p-type semiconductor layer via a fifth solution process;

S3023: forming an n-type semiconductor layer over the self-assembly layer via a sixth solution process;

S3024: forming a source electrode and a drain electrode over the n-type semiconductor layer.

The property and performance of the TFT as described above have been tested. The test results for the switching ratios of the TFT according to some embodiments are shown in FIG. 4A and FIG. 4B.

Figure 4A:
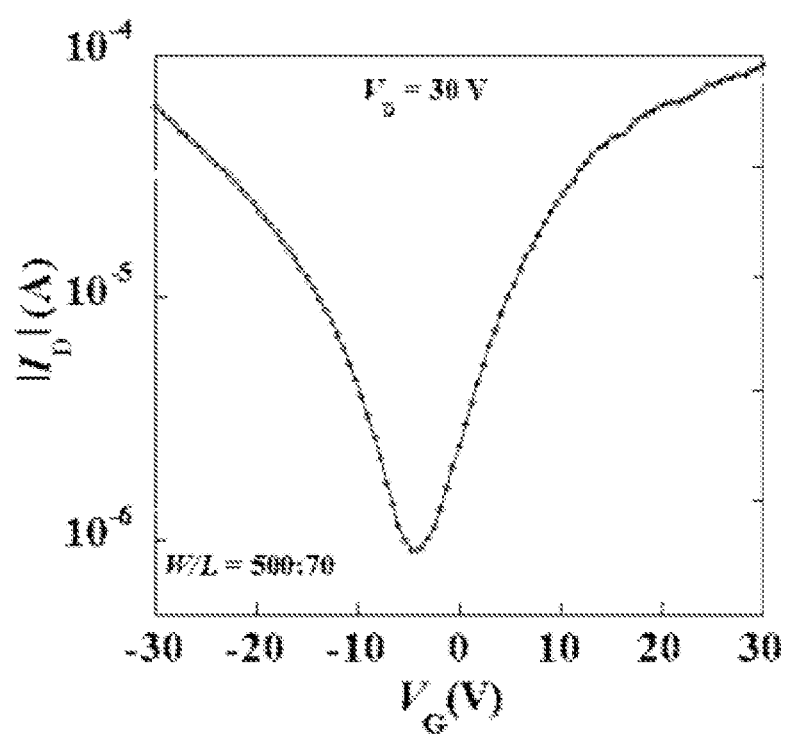
FIG. 4A illustrates an n-type switching ratio curve of a TFT according to some embodiments of the present disclosure.
Figure 4B:
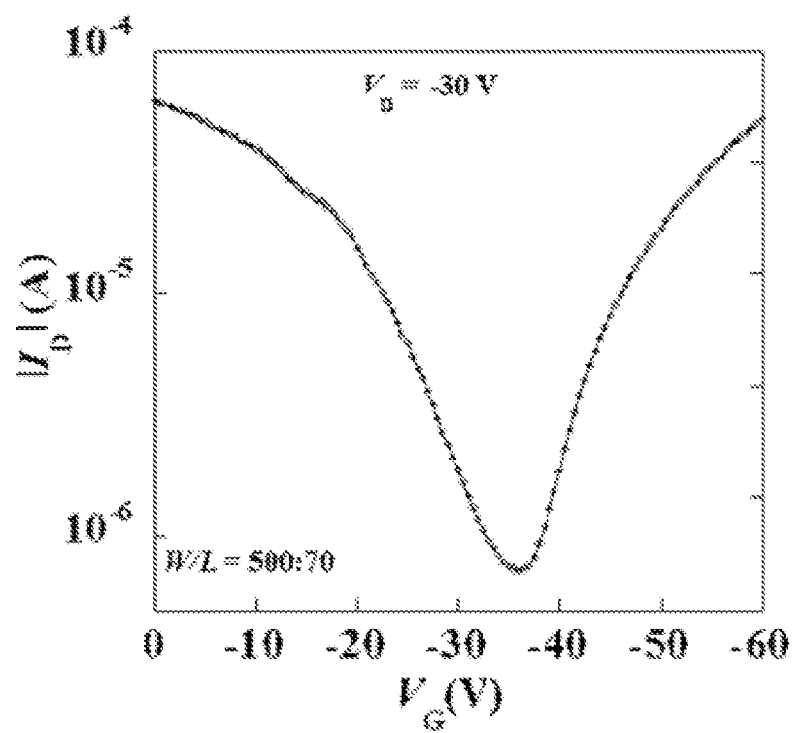
FIG. 4B illustrates a p-type switching ratio curve of a TFT according to some embodiments of the present disclosure.

In FIGS. 4A and 4B, W/L represents a ratio of a width and a length of a TFT; the horizontal coordinate $V_G$ represents a voltage on the gate electrode of the TFT, having a unit of volt (V); the vertical coordinate ID represents a current through the drain electrode, having a unit of amp (A). The testing results of the switching ratio of the n-type TFT is shown in FIG. 4A, and the testing results of the switching ratio of the p-type TFT is shown in FIG. 4B. As indicated by FIGS. 4A and 4B, both the n-type TFT and the p-type TFT have good switching ratios.

Figure 5A:
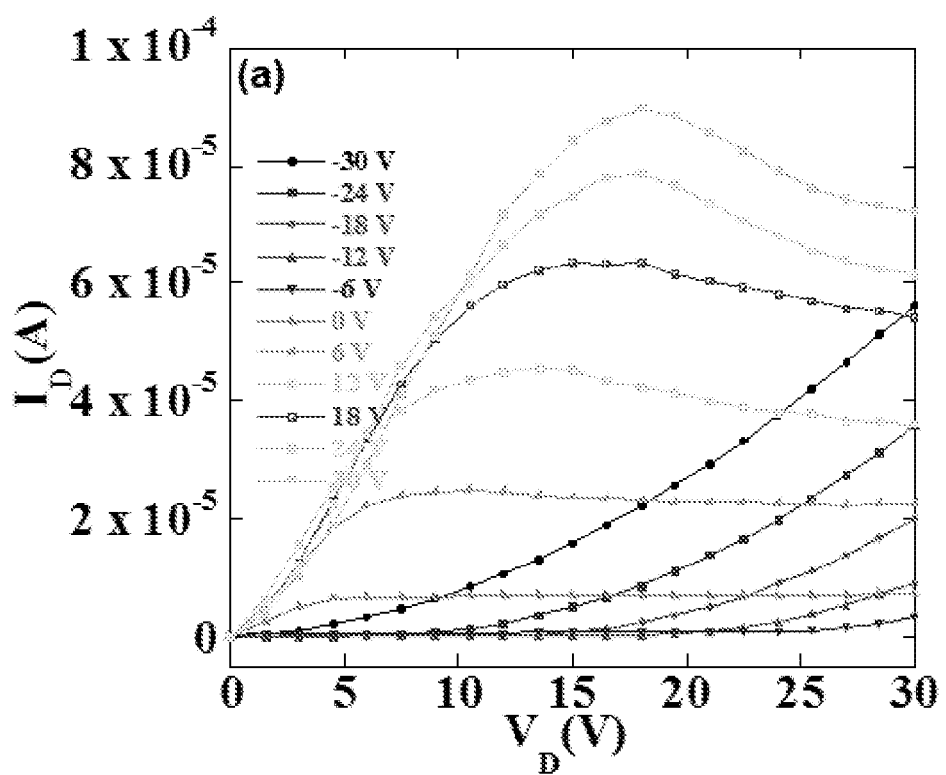
FIG. 5A illustrates output I-V curves for n-type forward currents of a TFT according to some embodiments.
Figure 5B:
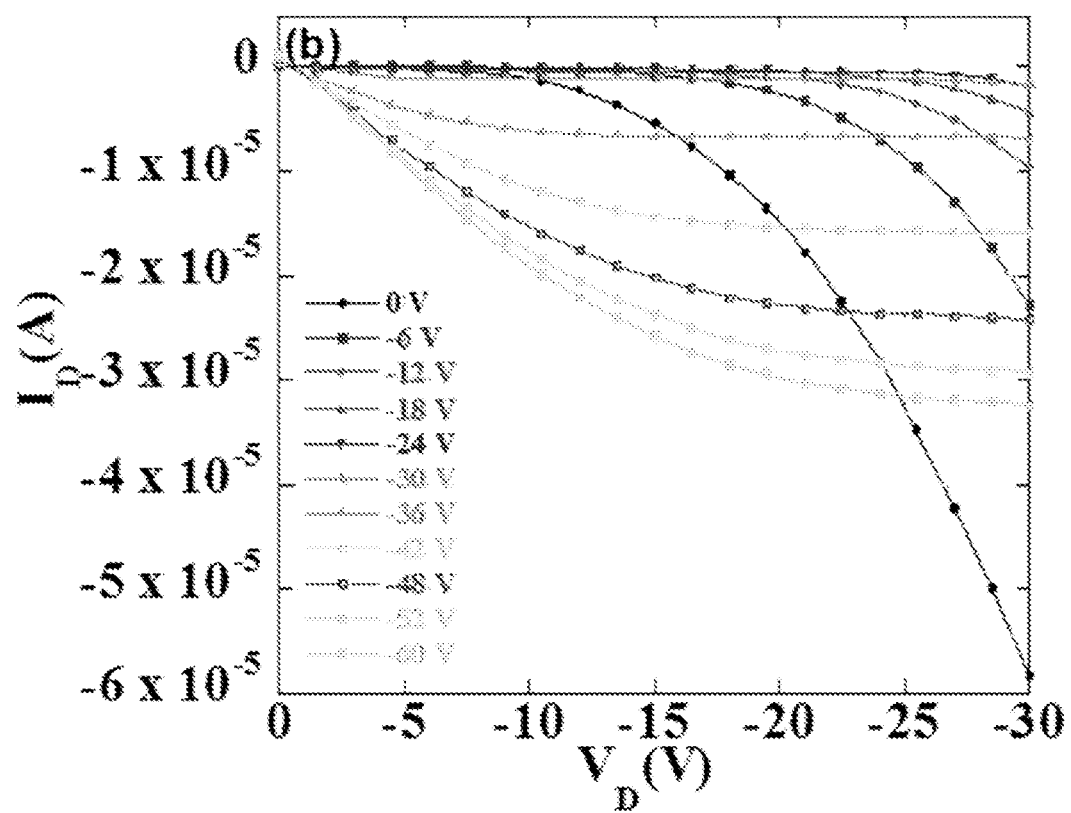
FIG. 5B illustrates output I-V curves for p-type reverse currents of a TFT according to some embodiments.

The test results for the output performance of the TFTs according to some embodiments are shown in FIG. 5A and FIG. 5B. Specifically, FIG. 5A illustrates output I-V curves for n-type forward currents of a TFT according to some embodiments; and FIG. 5B illustrates output I-V curves for p-type reverse currents of a TFT according to some embodiments.

In view of the above, various embodiments disclosed herein provide a semiconductor thin film, including an n-type semiconductor layer, a p-type semiconductor layer, and a self-assembly layer, wherein the n-type semiconductor layer and the p-type semiconductor layer are stacked over one another, and the self-assembly layer comprises a phosphate ester self-assembly material, and is disposed between, and configured to contact, the n-type semiconductor layer and the p-type semiconductor layer.

Because of the stacked arrangement of the n-type semiconductor layer and the p-type semiconductor layer, the semiconductor thin film can be used as an active layer of a bipolar TFT. Additionally, during the manufacturing of the bipolar TFT, the n-type semiconductor layer and the p-type semiconductor layer can be separately fabricated. Compared with a conventional bipolar TFT having either a mixed configuration or a single semiconductor material, the TFTs disclosed herein can have improved reliability, stability, and performance.

Furthermore, the arrangement of the self-assembly layer can effectively mediate a good contact between the n-type semiconductor layer and the p-type semiconductor layer, further leading to improved performance of the TFT.

In some embodiments of the present disclosure, because of the compositions selected for each of the n-type semiconductor layer (e.g., an inorganic oxide semiconductor material, such as indium oxide), the self-assembly layer (e.g., a phosphate ester), and the p-type semiconductor layer (e.g., an organic p-type semiconductor material), during manufacturing of the TFT, a solution process can be employed for fabrication of each of the above layers. The solution process can greatly simplify the manufacturing process, and is especially useful for the fabrication of large-area and flexible electronic components.

All references cited in the present disclosure, if any, are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for manufacturing a semiconductor thin film, comprising:
    forming a first semiconductor layer over a substrate;
    forming an intermediate layer over the first semiconductor layer, wherein the intermediate layer is formed of a phosphate ester; and
    forming a second semiconductor layer over the intermediate layer;
    wherein:
        one of the forming a first semiconductor layer over a substrate and the forming a second semiconductor layer over the intermediate layer comprises: forming an n-type semiconductor layer;
        another of the forming a first semiconductor layer over a substrate and the forming a second semiconductor layer over the intermediate layer comprises: forming a p-type semiconductor layer;
        at least one of the forming a first semiconductor layer over a substrate, the forming an intermediate layer over the first semiconductor layer, or the forming a second semiconductor layer over the intermediate layer is via a solution process;
        each of the forming a first semiconductor layer over a substrate, the forming an intermediate layer over the first semiconductor layer, and the forming a second semiconductor layer over the intermediate layer is via a solution process;
        the intermediate layer comprises a self-assembly material, configured to reduce surface roughness between an inorganic semiconductor layer and an organic semiconductor layer and improve hole mobility in the p-type semiconductor material; and
        the self-assembly material comprises a phosphate ester capable of self-assembly, and the forming an intermediate layer over the first semiconductor layer comprises:
        submerging a top surface of the first semiconductor layer in an alcohol solution of the phosphate ester for a certain amount of time to form a thin layer of phosphate ester over the top surface of the first semiconductor layer.

2. The method of claim 1, wherein the forming an n-type semiconductor layer is via a solution process.

3. The method of claim 1, wherein the n-type semiconductor layer comprises an inorganic oxide semiconductor material.

4. The method of claim 3, wherein the n-type semiconductor layer comprises indium oxide, and the forming an n-type semiconductor layer comprises:
    coating a first surface with a solution of indium chloride; and
    treating the first surface to thereby form an n-type semiconductor thin film thereon.

5. The method of claim 4, wherein the forming an n-type semiconductor layer further comprises:
    patterning the n-type semiconductor thin film to thereby form the n-type semiconductor layer on the first surface.

6. The method of claim 1, wherein the p-type semiconductor layer comprises a p-type organic semiconductor material capable of solution preparation to thereby form the p-type semiconductor layer.

7. The method of claim 6, wherein the forming a p-type semiconductor layer comprises:
    spin-coating, printing, or pulling a solution of the p-type organic semiconductor material.

8. A method for manufacturing a thin-film transistor (TFT), comprising:
    forming a semiconductor active layer over a substrate, comprising the method for manufacturing a semiconductor thin film according to claim 1.

9. The method according to claim 8, further comprising:
    forming a source electrode and a drain electrode over the semiconductor thin film.

10. The method according to claim 9, wherein each of the forming a gate electrode over the substrate, the forming a gate electrode insulating layer over the gate electrode, the forming the semiconductor thin film over the gate electrode insulating layer, and the forming a source electrode and a drain electrode over the semiconductor thin film is carried out under a temperature of no more than 230° C.

11. The method according to claim 10, wherein each of the forming a gate electrode over the substrate, the forming a gate electrode insulating layer over the gate electrode, the forming the semiconductor thin film over the gate electrode insulating layer, and the forming a source electrode and a drain electrode over the semiconductor thin film is carried out via a solution process.

12. The method according to claim 8, further comprising, prior to the forming a semiconductor active layer over a substrate:
    forming a gate electrode over the substrate; and
    forming a gate electrode insulating layer over the gate electrode;
    wherein:
        the forming a semiconductor active layer over a substrate comprises:
            forming the semiconductor thin film over the gate electrode insulating layer.

13. The method according to claim 12, wherein at least one of the forming a gate electrode over the substrate and the forming a source electrode and a drain electrode over the semiconductor thin film comprises:
    printing a conductive material, wherein the conductive material comprises at least one of silver gel, PEDOT, or a carbon nanotube.

* * * * *